(12) United States Patent
Norberg et al.

(10) Patent No.: US 9,118,165 B1
(45) Date of Patent: Aug. 25, 2015

(54) MULTI-WAVELENGTH LASER CAVITY

(71) Applicant: Aurrion, Inc., Goleta, CA (US)

(72) Inventors: Erik Johan Norberg, Santa Barbara, CA (US); Brian R. Koch, San Carlos, CA (US); Gregory Alan Fish, Santa Barbara, CA (US)

(73) Assignee: Aurrion, Inc., Goleta, CA (US)

( * ) Notice: Subject to any disclaimer, the term of this patent is extended or adjusted under 35 U.S.C. 154(b) by 0 days.

(21) Appl. No.: 13/920,954

(22) Filed: Jun. 18, 2013

(51) Int. Cl.
*H01S 3/10* (2006.01)
*H01S 3/08* (2006.01)

(52) U.S. Cl.
CPC .................................. *H01S 3/08086* (2013.01)

(58) Field of Classification Search
CPC ......... H01S 5/141; H01S 5/22; H01S 3/0632; H01S 3/0635; H01S 3/06729; H01S 3/06754; H01S 3/06791; H01S 3/08027; H01S 3/08059
USPC ........................................................... 372/23
See application file for complete search history.

(56) References Cited

U.S. PATENT DOCUMENTS

| 5,351,262 | A | 9/1994 | Poguntke et al. | |
|---|---|---|---|---|
| 5,384,797 | A | 1/1995 | Welch et al. | |
| 6,654,516 | B2 * | 11/2003 | So | 385/27 |
| 6,693,925 | B2 * | 2/2004 | Hoose et al. | 372/6 |
| 6,697,411 | B2 * | 2/2004 | Hoose et al. | 372/92 |
| 7,106,920 | B2 * | 9/2006 | Liu | 385/14 |
| 2006/0092993 | A1 * | 5/2006 | Frankel | 372/18 |
| 2011/0234435 | A1 * | 9/2011 | Woodward et al. | 341/137 |

OTHER PUBLICATIONS

Doerr, et al., "Wavelength Selectable Laser With Inherent Wavelength and Single-Mode Stability", IEEE Photonics Technology Letters, vol. 9, No. 11, Nov. 11, 1997, pp. 3.
Nicholes, et al., "8-channel InP Monolithic Tunable Optical Router for Packet Forwarding", OSA/OFC/NFOEC 2011, © Optical Society of America, (2011), pp. 3.
Nicholes, et al., "An 8×8 InP Monolithic Tunable Optical Router (MOTOR) Packet Forwarding Chip", Journal of Lightwave Technology, vol. 28, No. 4, Feb. 15, 2010, pp. 10.
Zirngibl, et al., "An 1 &Channel Multifrequency Laser", IEEE Photonics Technology Letters, vol. 8, No. 7, Jul. 7, 1996, pp. 3.

* cited by examiner

*Primary Examiner* — Xinning Niu
*Assistant Examiner* — Vu A Vu
(74) *Attorney, Agent, or Firm* — Schwegman Lundberg & Woessner, P.A.

(57) ABSTRACT

Embodiments of the invention describe various configurations for a multi-wavelength laser cavity. A laser cavity may include a shared reflector and a plurality of reflectors. Each of the plurality of reflectors and the shared reflector together form one of the plurality of output wavelength channels.
A shared filter is utilized to filter the optical signal of the laser cavity to comprise a subset of a plurality of cavity modes. A (de)multiplexer, comprising a plurality of filtering elements), receives the optical signal and further selects and separates the final lasing wavelengths from the selected subset of cavity modes, and each filtering element outputs an optical signal having a wavelength for one of the output wavelength channels.

19 Claims, 5 Drawing Sheets

MULTI-WAVELENGTH LASER CAVITY

FIELD

Embodiments of the invention generally pertain to optical devices and more specifically to multi-wavelength lasers.

BACKGROUND

Prior art solutions for creating multi-wavelength laser sources require a large device footprint. Some solutions utilize an array of fixed wavelength lasers, where each laser has a fixed wavelength output. The disadvantage of this type of solution is that it requires one laser cavity for every desired output wavelength—thereby having a large device size and requiring a large number of components such as gain/phase/mirror elements, drivers, control loops, etc. Other prior art solutions utilize large intra-cavity filters such as arrayed wavelength gratings (AWGs); reliance on this type of filter further limits the functionality of the laser device, as this type of filter relies on non-linear gain effects to achieve single mode operation for each output wavelength—such effects are not suitable for full gain bandwidth applications.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DESCRIPTION

Embodiments of the invention describe various configurations for a multi-wavelength laser cavity. Throughout this specification, several terms of art are used. These terms are to take on their ordinary meaning in the art from which they come, unless specifically defined herein or the context of their use would clearly suggest otherwise. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Figure 1:
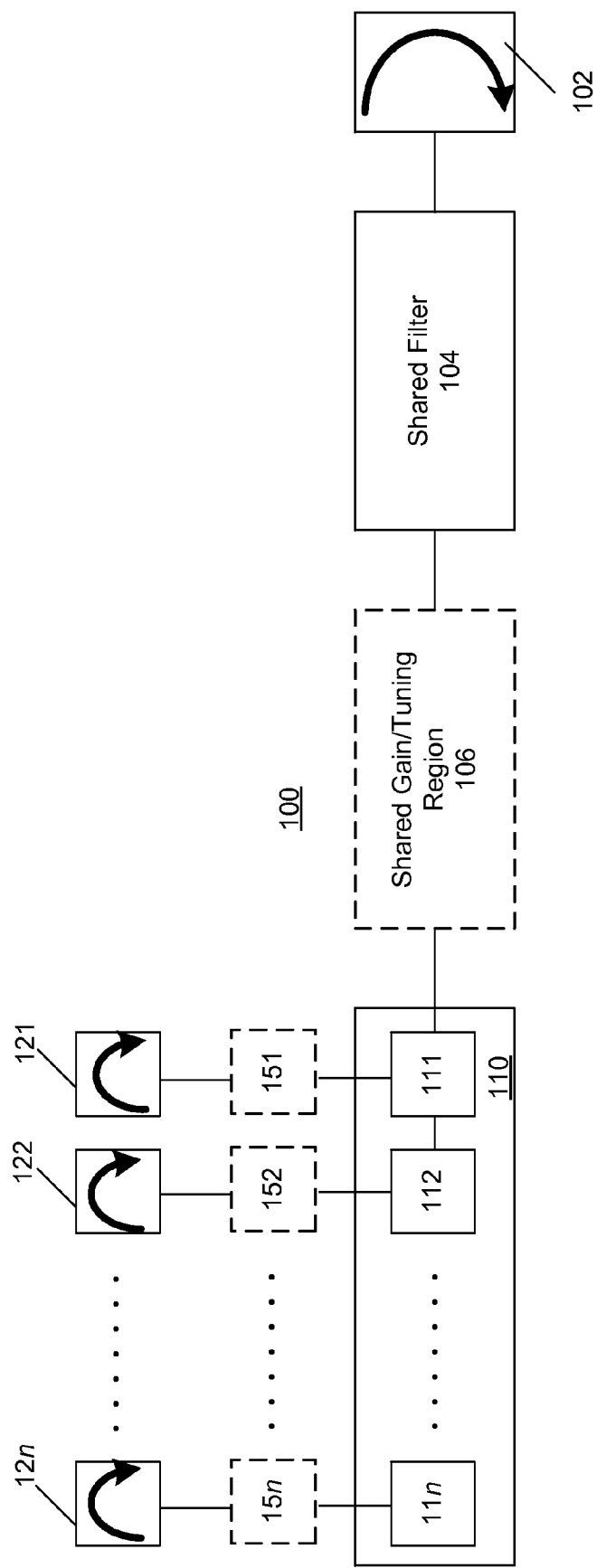
FIG. 1 illustrates a block diagram of multi-wavelength laser cavity configurations according to embodiments of the invention.

FIG. 1 illustrates a block diagram of multi-wavelength laser cavity configurations according to embodiments of the invention. Laser cavity 100 is illustrated as including shared reflector 102 and plurality of reflectors 121-12$n$, which are shown to form n optical paths/channels (i.e., each of said n optical paths 'share' reflector 102 and individually utilize one of reflectors 121-12$n$), each path/channel having a different output wavelength. Placed between shared reflector 102 and reflectors 121-12$n$ are shared filter 104, shared gain region 106—or alternatively, a shared tuning section, such as a phase region, and (de)multiplexer (herein referred to as 'mux') 110. A shared gain section may be used to provide power to all modes, while a shared tuning section may be used to tune the phase of all modes simultaneously In some embodiments, plurality of gain regions 151-15$n$ (and/or a plurality of tuning regions, such as phase regions) may be utilized. Said plurality of gain regions correspond to each of the n optical paths (and thus, each of the n wavelengths). Gain/tuning regions specific to each possible output signal wavelength may be used, for example, to relieve four wave mixing instability (i.e., when interactions between two wavelengths potentially produce extra wavelengths in the output signal), to level channel amplitude and phase, etc. In some embodiments, these regions are controlled such that only one channel is adjusted in amplitude and/or phase.

As described in further detail below, shared filter 104 and mux 110 both function together to select and separate the outputs of the n optical paths (which are output as a multi-wavelength output signal via an output port (not shown)). In this embodiment, shared filter 104 selects several modes from a plurality of cavity modes (e.g., a wavelength range or a mode order); mux 110 includes n filtering elements 111-11$n$ that further select and separate the final lasing wavelengths from the several modes selected by filter 104, thereby providing laser cavity 100 with n output signal wavelengths. In other embodiments, mux 100 may comprise m filtering elements for n optical paths, where m>n (these embodiments are described in further detail below).

Filtering elements 111-11$n$ may comprise, for example, an array of Finite Impulse Response (FIR) filters or an array of Infinite Impulse Response (IIR) filters. While both types of filtering elements filter light to a specific wavelength, an FIR filter's impulse response is of finite duration, while an IIR filter may utilize internal feedback to have an infinite impulse response. Shared filter 104 may also comprise an FIR or an IIR filter. Said filters may also comprise a narrowband filter (e.g., a narrowband IIR ring filter), a broadband filter (e.g., a broadband distributed-feedback reflector grating (DBR), an asymmetric Mach-Zehnder Interferometer (AMZI), a directional coupler (i.e., a coupler having a waveguide configured to support one fundamental mode), etc. Said filtering elements/filters may also be athermal.

Shared filter 104 may select a subset of a plurality of cavity modes, and filtering elements 111-11$n$ of mux 110 further select and separate the final lasing wavelengths from the several modes selected by filter 104 for their respective output wavelength channel. Alone, said mux filtering elements permit a plurality of wavelengths comprising various modes to pass through, due to the filter's free spectral range (i.e., axial mode separation). Laser oscillation may then still occur on multiple axial (i.e., longitudinal) modes, which have essentially the same transverse shape but different optical frequencies, separated by the free spectral range. Shared filter 104 in conjunction with the mux filter together eliminates any unwanted modes, as described below. Thus, light passing through shared filter 104 comprises multiple wavelengths of a single mode, and light passing through mux 110 is separated by wavelength.

The use of shared filter 104 and mux 110 allows for wavelength selective components for a multi-wavelength laser to be included in laser cavity 100, thereby reducing the device footprint compared to prior art solutions that utilize an array of fixed wavelength lasers or variations in the size and dimensions of laser components (e.g., distance between gratings, multiple waveguides with varying dimensions, etc.) that are impractical to implement within a laser cavity.

Figure 2:
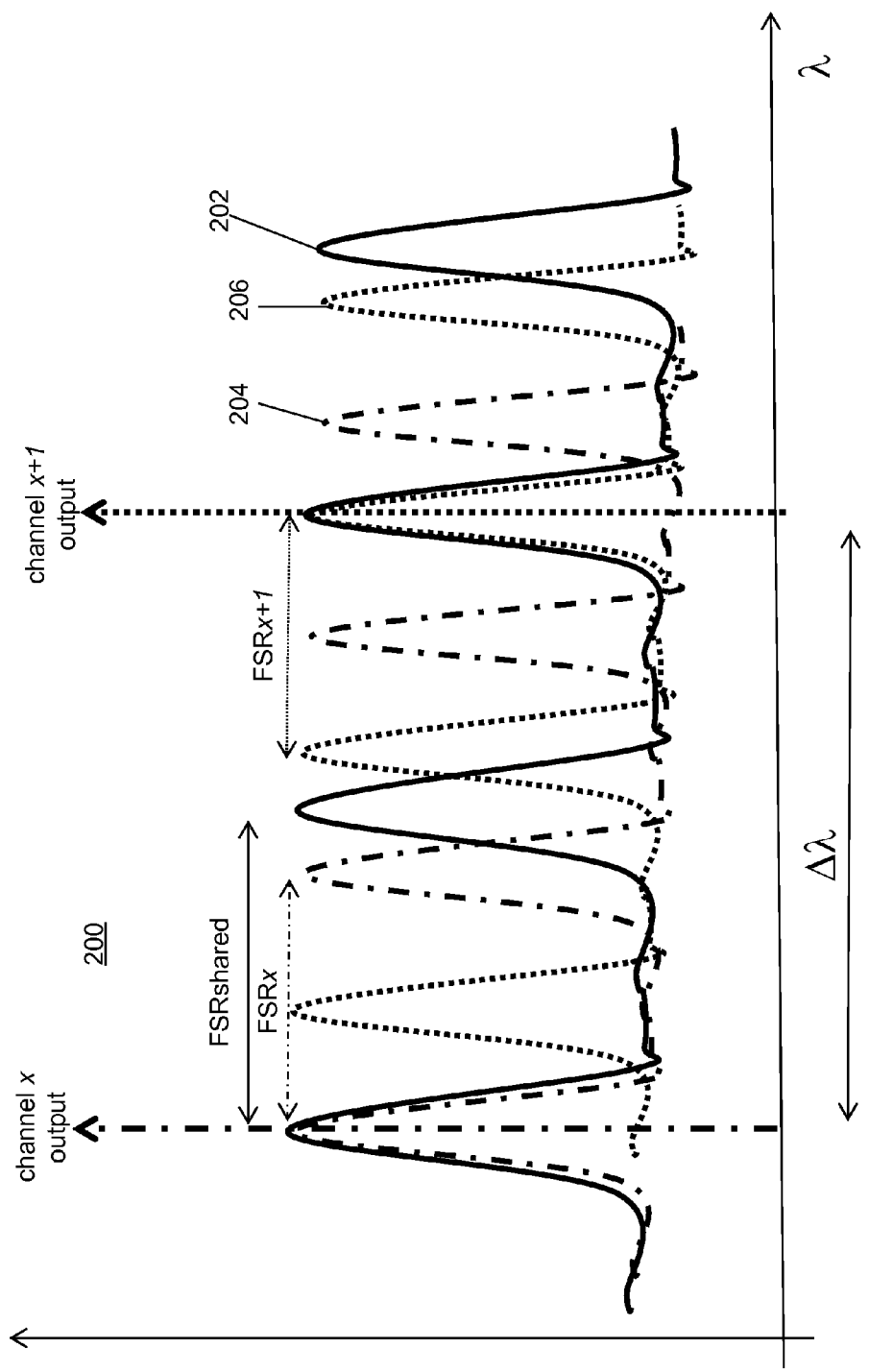
FIG. 2 is a graph illustrating a spectral response of a multi-wavelength laser utilizing one or more narrowband filters according to an embodiment of the invention.

FIG. 2 is a graph illustrating a spectral response of a multi-wavelength laser utilizing one or more narrowband filters according to an embodiment of the invention. Graph 200 illustrates the free spectral range (FSR) of filters used in a multi-wavelength laser cavity comprising n output wavelength channels.

Graph 200 is illustrated as including curve 202 illustrating the free spectral range (FSR) of a shared IIR filter (referred to herein as $FSR_{shared}$), curve 204 illustrating the FSR of a first mux IIR filter (i.e., the mux filter element corresponding to output wavelength channel x, and referred to herein as $FSR_x$), and curve 206 illustrating the FSR of a second MUX filter (i.e., the mux filter corresponding to adjacent optical channel x+1, and referred to herein as $FSR_{x+1}$).

In this embodiment the "wavelength grid" is digitally defined by $FSR_{shared}$, and the filters of the mux are aligned with various orders of $FSR_{shared}$. As shown in graph 200, the wavelength for the output of channel x is defined by aligning one filter order of the $FSR_{shared}$ with a filter order of $FSR_x$ while neighboring filter orders of $FSR_x$ are suppressed using the vernier mechanism and the wavelength for the output of channel x+1 is similarly defined by the aligning a different filter order of $FSR_{shared}$ with a filter order of $FSR_{x+1}$.

In embodiments where said shared filter comprises an IIR filter (e.g., a mode ring-filter), the channel spacing may be configured and set to an integer multiple of $FSR_{shared}$, thereby providing tunability to a multi-wavelength laser—i.e., moving the selected cavity mode to change the wavelength outputs of the n channels.

Figure 3:
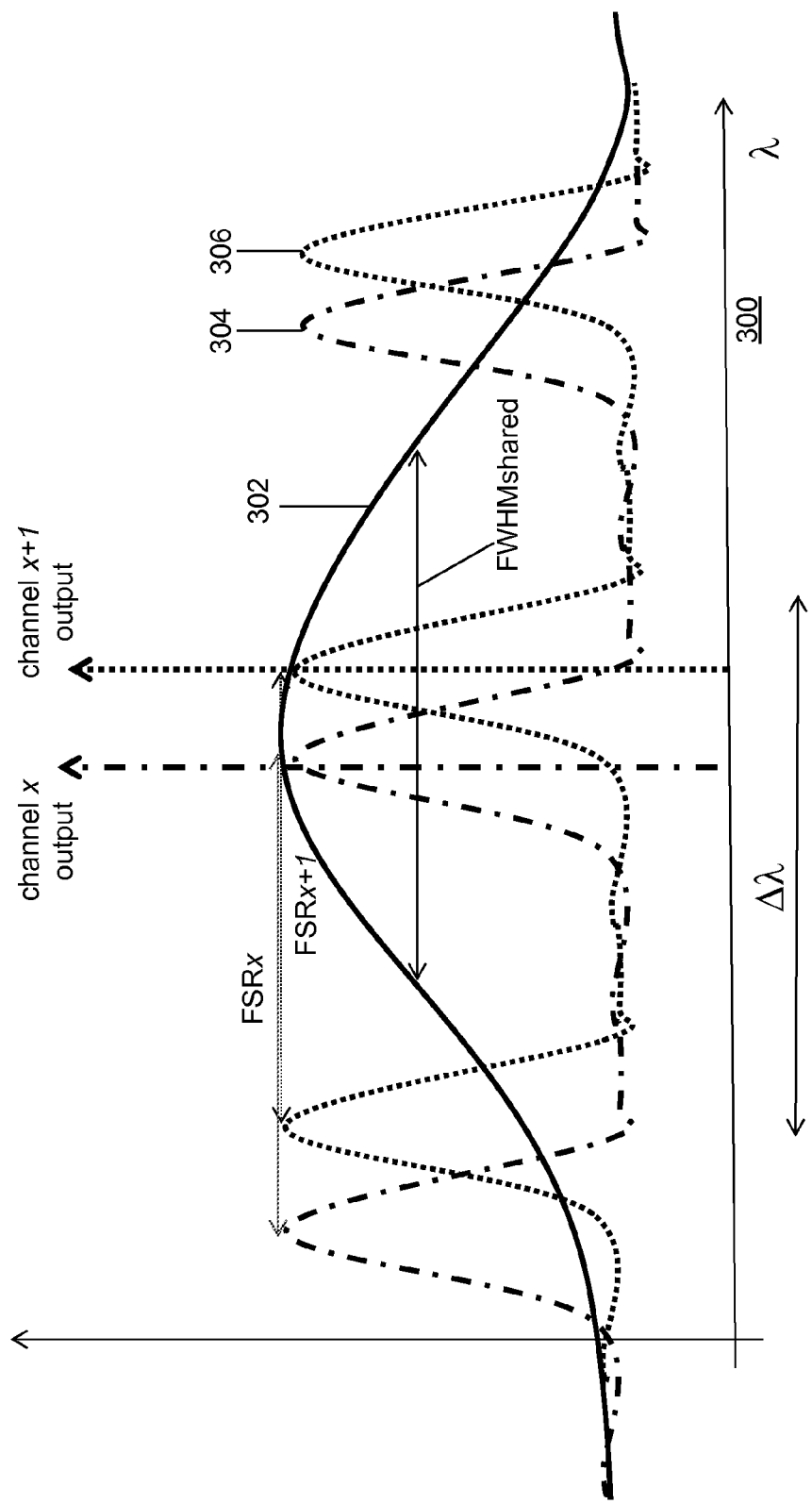
FIG. 3 is a graph illustrating a spectral response of a multi-wavelength laser utilizing one or more broadband filters according to an embodiment of the invention.

FIG. 3 is a graph illustrating a spectral response of a multi-wavelength laser utilizing one or more broadband filters according to an embodiment of the invention. Graph 300 includes curve 302 illustrating the full width at half maximum (FWHM) response of a shared broadband filter, curve 304 illustrating the FSR of a first mux filter (i.e., the mux filter corresponding to optical channel x and referred to herein as $FSR_x$), and curve 306 illustrating the FSR of a second mux filter (i.e., the mux filter corresponding to optical channel x+1 and referred to herein as $FSR_{x+1}$).

As shown in graph 300, the wavelength for the output of channel x is defined $FSR_x$ within the selected mode order of curve 302, and the wavelength for the output of channel x+1 is defined by $FSR_{x+1}$ within the selected mode order of curve 302. In this embodiment, a mode order is selected by the shared broadband filter and the filters of the mux select wavelengths in this selected mode order; this channel selection does not rely on a Vernier operation, but instead the broadband filter aids in filtering out the next order of the mux. These embodiments of the invention may utilize ring filters with small radii such that their FSR is large enough to be filtered out.

Figure 4:
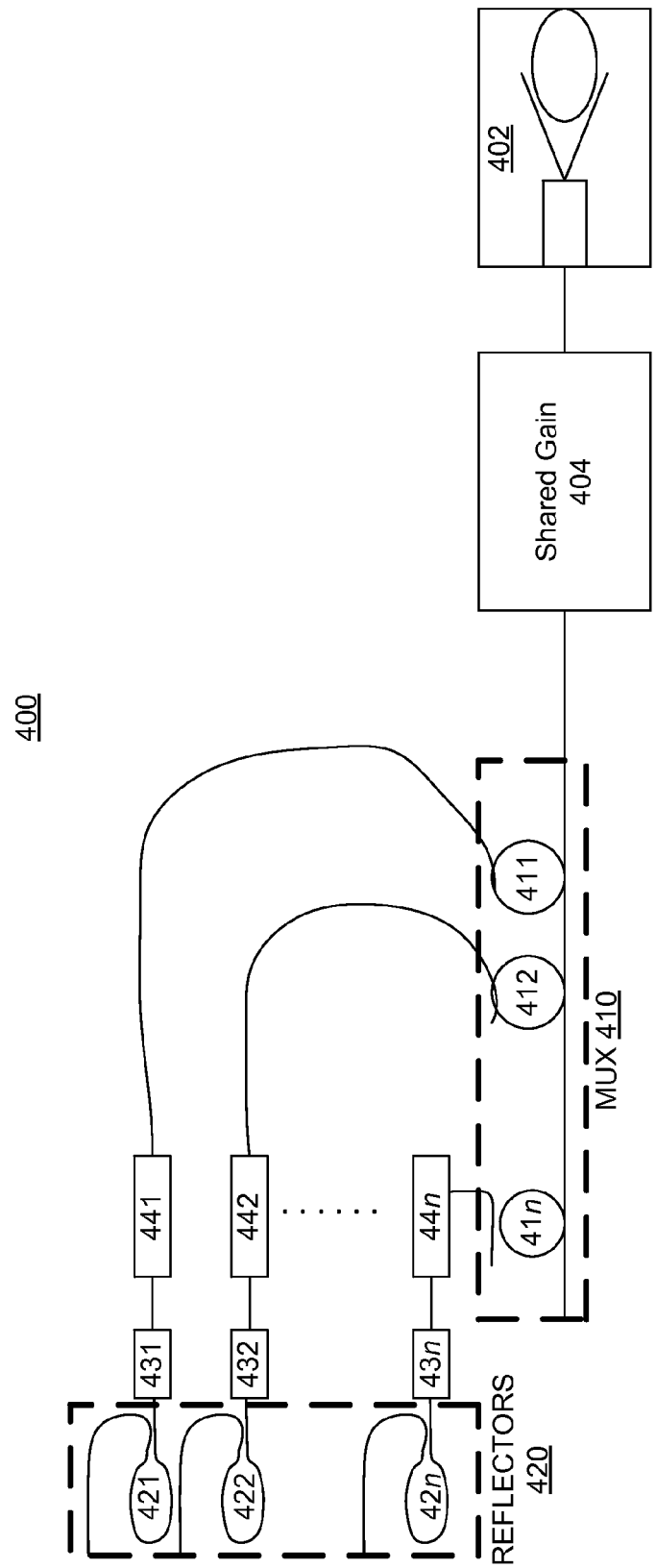
FIG. 4 is an illustration of a multi-wavelength laser cavity utilizing a plurality of infinite impulse response filter elements according to an embodiment of the invention.

FIG. 4 is an illustration of a multi-wavelength laser cavity utilizing IIR filter elements according to an embodiment of the invention. Laser cavity 400 includes shared gain section 404, narrowband filter 402, which is illustrated as comprising an add-drop ring filter and a 1×2 splitter, IIR mux 410, output gain sections 431-43n, output phase sections 441-44n, and broadband reflectors 420.

In this embodiment, IIR mux 410 includes IIR filter elements 411-41n and is utilized in conjunction with shared filter 402. In this example embodiment, IIR mux 410 is shown to comprise an array of add-drop ring filters. In this implementation, the output channels are selected using the Vernier mechanism which is enabled by using the different FSRs of shared filter 402 and mux ring-filters 411-41n. As described above with reference to FIG. 2, in embodiments where shared filter 402 comprises a narrowband ring filter, the multiplexer channel spacing may be an integer of the FSR of said narrowband ring-filter.

IIR mux 410 comprises an n channel mux with each channel connected to broadband reflectors 420 (including reflectors 421-42n) where n is the number of desired output channels. This embodiment may not yield a reconfigurable channel spacing, but ensures single mode operation due to shared filter 402 (in comparison to the prior art multi-frequency lasers, which rely on gain non-linearity). In similar embodiments, an FIR mux could also be used together with a broadband filter to help suppress the undesired neighboring filter orders.

Figure 5:
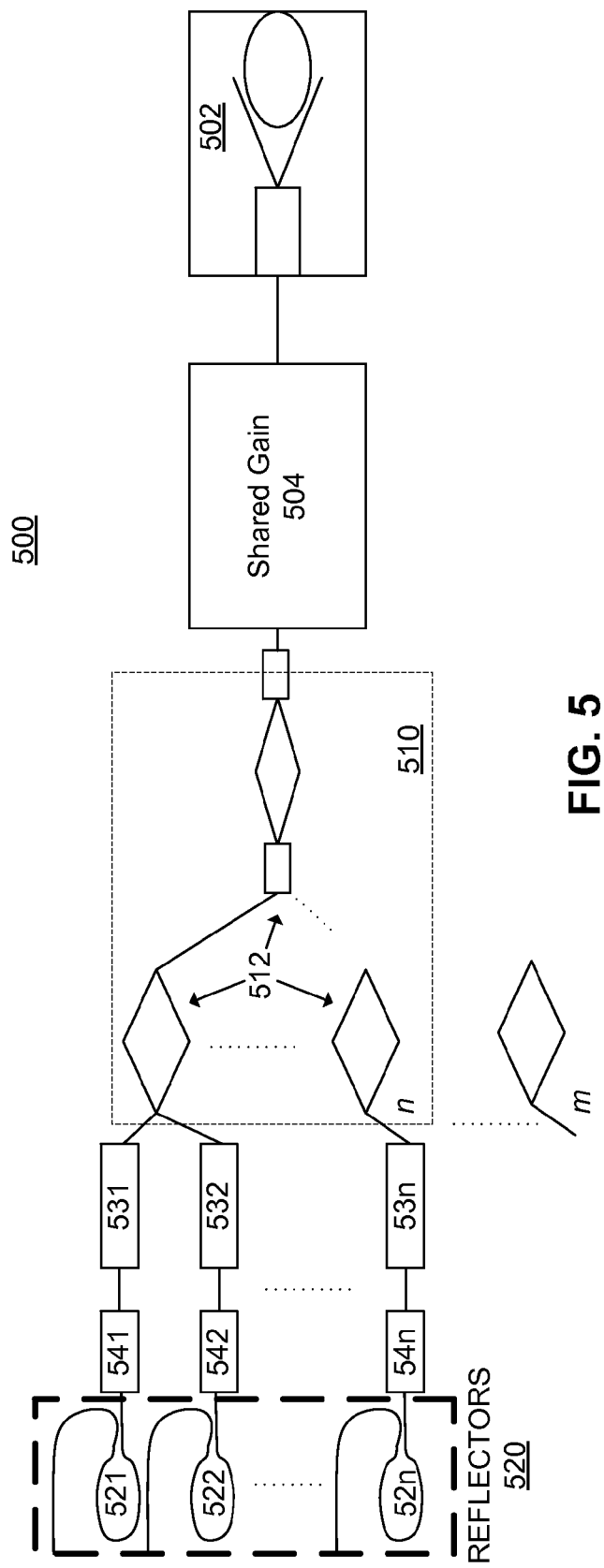
FIG. 5 is an illustration of a multi-wavelength laser cavity utilizing a finite impulse response interleaver according to an embodiment of the invention.

FIG. 5 is an illustration of a multi-wavelength laser cavity utilizing an FIR interleaver according to an embodiment of the invention. In this embodiment, laser cavity 500 is shown to include shared filter 502, shared gain section 504, optical FIR interleaver 510 with m channels (m>=n), output gain sections 531-53n, output phase sections 541-54n, and broadband reflector 520 (including reflectors 521-52n). In this embodiment, by increasing m, undesirable modes from the next order in mux 510 are suppressed, due to the gain roll-off and or mirror/reflector response of broadband reflectors 520.

Optical interleaver 510 is shown to comprise plurality of asymmetric Mach-Zehnder Interfereometers (AMZIs) 512 to separate wavelengths from shared gain section 504 to m specific optical paths, where m>=n and n is number of channels. In alternative embodiments, an FIR mux such as an arrayed waveguide grating (AWG) may be used. The use of shared narrowband filter 502 to help select a single cavity mode within each channel of the interleaver 512, thus assuring that each laser channel mode is not reliant on non-linear gain effects, enabling this FIR-based solution suitable for full gain bandwidth applications.

Reference throughout the foregoing specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

The above described embodiments of the invention may comprise SOI or silicon based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material.

III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V based materials may be significantly higher than in silicon based materials, as electron speed in III-V semiconductors is much faster than that in silicon. In addition, III-V materials have a direct bandgap which enables efficient creation of light from electrical pumping. Thus, III-V semiconductor materials enable photonic operations with an increased efficiency over silicon for both generating light and modulating the refractive index of light.

Thus, III-V semiconductor materials enable photonic operation with an increased efficiency at generating light from electricity and converting light back into electricity. The low optical loss and high quality oxides of silicon are thus combined with the electro-optic efficiency of III-V semiconductors in the heterogeneous optical devices described below; in embodiments of the invention, said heterogeneous devices utilize low loss heterogeneous optical waveguide transitions between the devices' heterogeneous and silicon-only waveguides.

Magneto-optic materials allow heterogeneous PICs to operate based on the magneto-optic (MO) effect. Such devices may utilize the Faraday Effect, in which the magnetic field associated with an electrical signal modulates an optical beam, offering high bandwidth modulation, and rotates the electric field of the optical mode enabling optical isolators. Said magneto-optic materials may comprise, for example, materials such as such as iron, cobalt, or yttrium iron garnet (YIG).

Crystal substrate materials provide heterogeneous PICs with a high electro-mechanical coupling, linear electro optic coefficient, low transmission loss, and stable physical and chemical properties. Said crystal substrate materials may comprise, for example, lithium niobate (LiNbO3) or lithium tantalate (LiTaO3).

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The invention claimed is:

1. A multi-wavelength laser comprising:
a multi-wavelength lasing cavity comprising a plurality of output wavelength channels, including a wavelength channel for each wavelength of the multi-wavelength laser, the multi-wavelength lasing cavity including:
at least one gain section;
a shared reflector shared by each of the plurality of output wavelength channels;
a plurality of reflectors to form the plurality of output wavelength channels with the shared reflector, wherein each of the plurality of reflectors and the shared reflector form one of the plurality of output wavelength channels;
a shared filter shared by each of the plurality of output wavelength channels to output an optical signal comprising at most one cavity mode for each of the plurality of output wavelength channels;
a (de)multiplexer comprising a plurality of filtering elements, each (de)multiplexer channel output to receive the optical signal comprising at most one cavity mode for each of the plurality of output wavelength channels and to output an optical signal having a wavelength for one of the output wavelength channels; and
a shared phase section disposed between the shared reflector and the (de)multiplexer; and
an output to output a multi-wavelength optical signal from the plurality of output wavelength channels of the first multi-wavelength lasing cavity.

2. The multi-wavelength laser of claim 1, wherein the at least one gain section of the multi-wavelength lasing cavity comprises a shared gain section disposed between the shared reflector and the (de)multiplexer.

3. The multi-wavelength laser of claim 1, wherein the at least one gain section of the multi-wavelength lasing cavity comprises a plurality of gain sections disposed between the (de)multiplexer and the plurality of reflectors, each of the plurality of gain sections corresponding to one of the plurality of output wavelength channels.

4. The multi-wavelength laser of claim 3, wherein an amplitude of at most one of the optical signals from the plurality of output wavelength channels is adjusted.

5. The multi-wavelength laser of claim 1, wherein the shared filter of the multi-wavelength lasing cavity comprises one of a Finite Impulse Response (FIR) filter or an Infinite Impulse Response (IIR) filter.

6. The multi-wavelength laser of claim 5, wherein the shared filter of the multi-wavelength lasing cavity comprises an IIR filter and is configurable to select one of a plurality of cavity modes for each of the plurality of output wavelength channels.

7. The multi-wavelength laser of claim 1, wherein the shared filter of the multi-wavelength lasing cavity comprises one of a narrowband filter or a broadband filter.

8. The multi-wavelength laser of claim 1, wherein the shared filter of the multi-wavelength lasing cavity comprises one of an add-drop ring filter, a grating, a directional coupler or an asymmetric Mach Zehnder interferometer (AMZI).

9. The multi-wavelength laser of claim 1, wherein at least one of the shared filter or the (de)multiplexer of the multi-wavelength lasing cavity is athermal.

10. The multi-wavelength laser of claim 1, wherein the (de)multiplexer of the multi-wavelength lasing cavity comprises a plurality of Infinite Impulse Response (IIR) filters.

11. The multi-wavelength laser of claim 10, wherein the plurality of IIR filters comprises an array of add-drop ring filters.

12. The multi-wavelength laser of claim 1, wherein the (de)multiplexer of the multi-wavelength lasing cavity comprises a plurality of Finite Impulse Response (FIR) filters.

13. The multi-wavelength laser of claim 12, wherein the plurality of FIR filters comprises at least one of an asymmetric Mach-Zehnder interferometer (AMZI) or an Arrayed Waveguide Grating (AWG).

14. The multi-wavelength laser of claim 1, wherein a number of the plurality of filtering elements of the (de)multiplexer is equal to a number of the plurality of output wavelength channels.

15. The multi-wavelength laser of claim 1, wherein a number of the plurality of filtering elements of the (de)multiplexer is greater than a number of the plurality of output wavelength channels.

16. The multi-wavelength laser of claim 2, wherein the at least one gain section of the multi-wavelength lasing cavity consists of only the shared gain section disposed between the shared reflector and the (de)multiplexer.

17. The multi-wavelength laser of claim 1, wherein the at least one gain section of the multi-wavelength lasing cavity comprises a shared gain section disposed between the shared reflector and the (de)multiplexer.

18. The multi-wavelength laser of claim 1, wherein the at least one gain section of the multi-wavelength lasing cavity comprises a plurality of gain sections disposed between the (de)multiplexer and the plurality of reflectors, each of the plurality of gain sections corresponding to one of the plurality of output wavelength channels.

19. A multi-wavelength laser comprising:
   a multi-wavelength lasing cavity comprising a plurality of output wavelength channels for each wavelength of the multi-wavelength laser, including:
      at least one gain section;
      a shared reflector shared by each of the plurality of output wavelength channels;
      a plurality of reflectors to form the plurality of output wavelength channels with the shared reflector, wherein each of the plurality of reflectors and the shared reflector form one of the plurality of output wavelength channels;
      a plurality of filters including a filter for each of the plurality of output wavelength channels to output an optical signal comprising at most one cavity mode for each of the plurality of output wavelength channels; and
      a (de)multiplexer comprising a plurality of filtering elements, each (de)multiplexer channel output to receive the optical signal comprising at most one cavity mode for each of the plurality of output wavelength channels and to output an optical signal having a wavelength for one of the output wavelength channels; and
   an output to output a multi-wavelength optical signal from the plurality of output wavelength channels of the multi-wavelength lasing cavity.

* * * * *